US008629685B2

(12) United States Patent
Hourne

(10) Patent No.: US 8,629,685 B2
(45) Date of Patent: Jan. 14, 2014

(54) DEVICE FOR MEASURING A VARIATION IN THE CAPACITANCE OF A VARIABLE CAPACITIVE STRUCTURE

(75) Inventor: Xavier Hourne, Cugnaux (FR)

(73) Assignee: Continental Automotive France, Toulouse (FR)

( * ) Notice: Subject to any disclaimer, the term of this patent is extended or adjusted under 35 U.S.C. 154(b) by 440 days.

(21) Appl. No.: 13/128,120

(22) PCT Filed: Oct. 29, 2009

(86) PCT No.: PCT/EP2009/007751
§ 371 (c)(1),
(2), (4) Date: May 6, 2011

(87) PCT Pub. No.: WO2010/051939
PCT Pub. Date: May 14, 2010

(65) Prior Publication Data
US 2011/0210753 A1    Sep. 1, 2011

(30) Foreign Application Priority Data

Nov. 7, 2008  (FR) ...................................... 08 06240

(51) Int. Cl.
*G01R 27/26* (2006.01)
(52) U.S. Cl.
USPC .......................................... 324/679; 324/678
(58) Field of Classification Search
USPC .......................................................... 324/679
See application file for complete search history.

(56) References Cited

U.S. PATENT DOCUMENTS 4,831,325 A * 5/1989 Watson, Jr. .................... 324/678
7,015,705 B2 * 3/2006 Inaba et al. .................... 324/678
7,098,675 B2 * 8/2006 Inaba et al. .................... 324/678
7,116,116 B2 * 10/2006 Ebihara et al. ................ 324/662
7,155,353 B2 * 12/2006 Okamoto et al. ............... 702/65
7,477,098 B2    1/2009 Dharmalinggam et al.

FOREIGN PATENT DOCUMENTS

| CN | 1266494 A | 9/2000 |
| CN | 101242164 A | 8/2008 |
| EP | 1 635 147 A2 | 3/2006 |
| WO | 00/31553 A1 | 6/2000 |
| WO | 2006/132960 A1 | 12/2006 |

OTHER PUBLICATIONS

International Search Report, dated Mar. 15, 2010, from corresponding PCT application.

* cited by examiner

*Primary Examiner* — Thomas F Valone
(74) *Attorney, Agent, or Firm* — Young & Thompson

(57) ABSTRACT

A device for measuring a variation in the capacitance of a variable capacitive structure, includes:
 a supply voltage;
 a reference capacitance;
 element for measuring a voltage across the terminals of the reference capacitance;
 a measurement capacitive structure; and
 elements for detecting a threshold voltage across the terminals of the reference capacitance. The device is configured/programmed so that the measurement capacitive structure is discharged, in a variable number of discharges, into the reference capacitance after the variable capacitive structure has been discharged, in a fixed number of discharges, into the reference capacitance and until the voltage ($V_S$) across the terminals of the reference capacitance has reached the threshold voltage. The variation in the variable number of discharges relative to a previously obtained number of discharges allows the variation in the capacitance of the variable capacitive structure to be estimated.

15 Claims, 2 Drawing Sheets

Fig 1: prior art
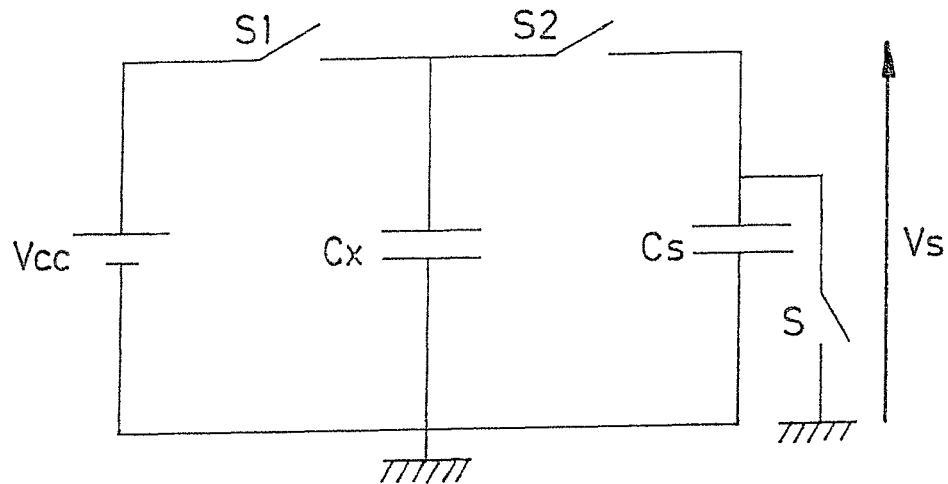
Fig 3
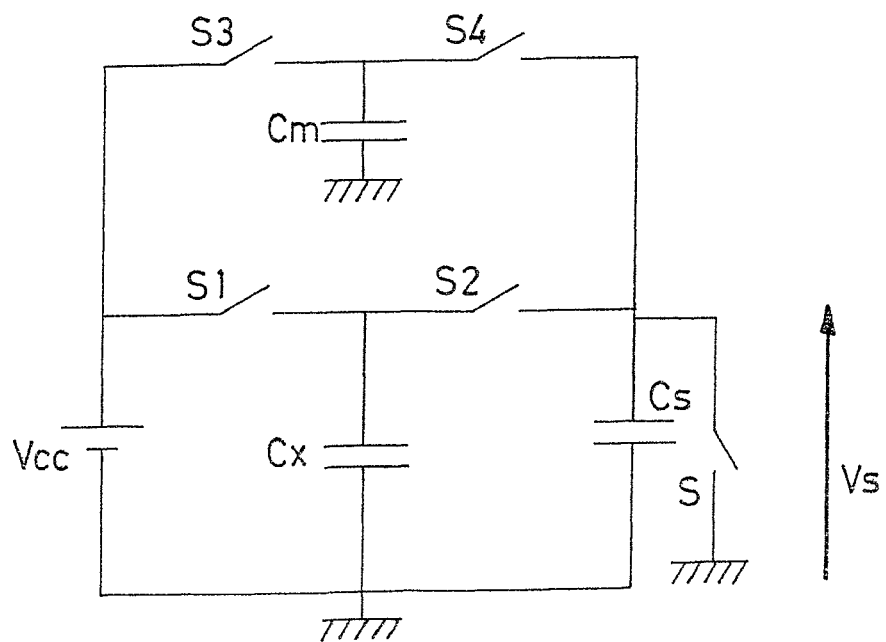

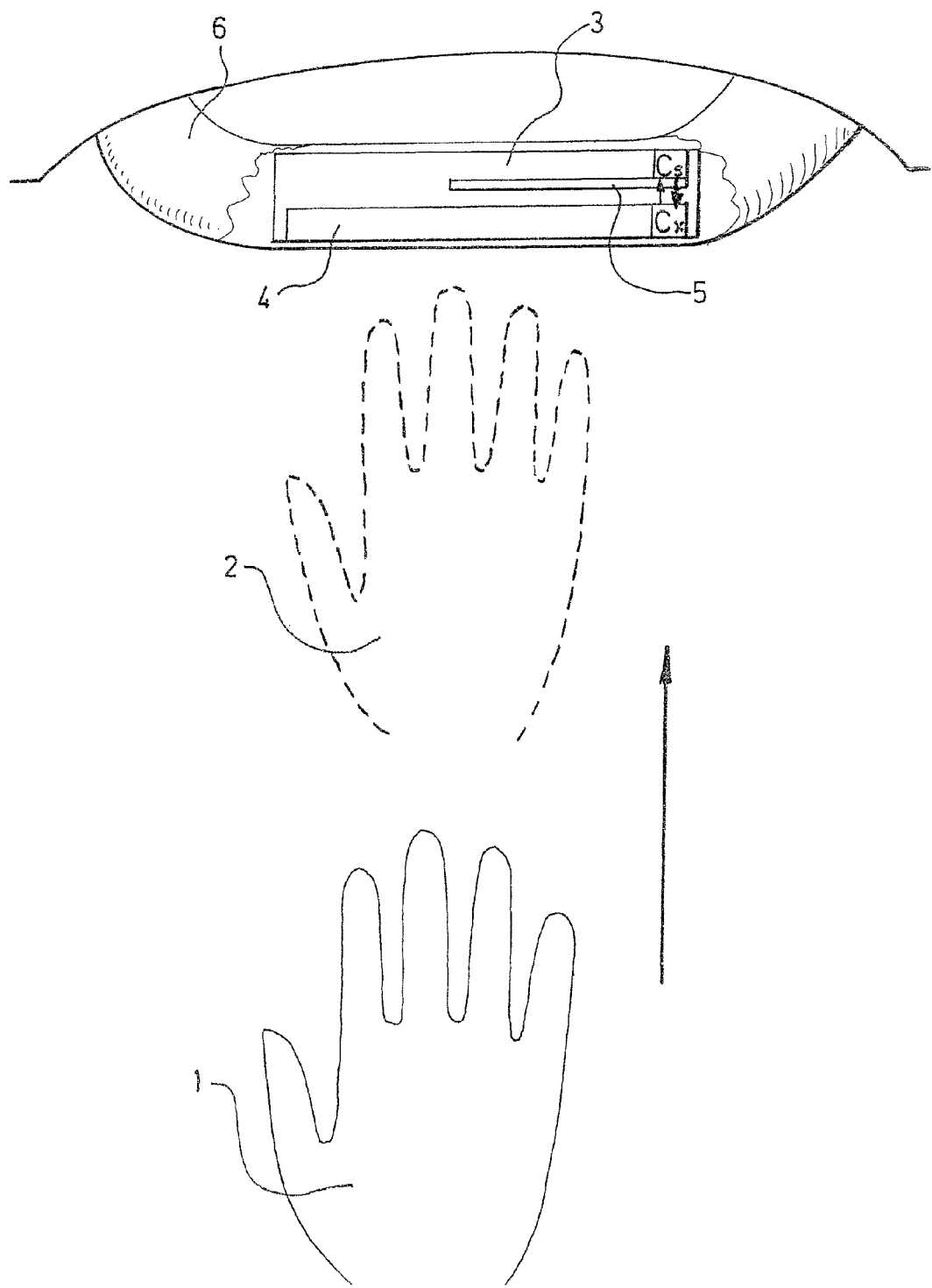

DEVICE FOR MEASURING A VARIATION IN THE CAPACITANCE OF A VARIABLE CAPACITIVE STRUCTURE

The present invention relates to charge-transfer capacitive sensor. It is particularly useful when such a sensor is applied in the door handles of a vehicle for what is called "hands free" access of the driver to his vehicle.

At the present time, certain automotive vehicles are equipped with "hands free" access, i.e. the driver of the vehicle no longer requires a key to open the doors of his vehicle. He possesses, instead of a key, an identification badge that is recognized by the electronic system of the vehicle.

To open a door, the driver first presses the door handle. A presence sensor, here a charge-transfer capacitive sensor located in the electronic module in the handle, detects the presence of the hand of the driver. This sensor is connected to the ECU (electronic control unit) of the vehicle and this unit sends a signal, via an LF (low frequency) antenna, to the identifier incorporated in the key. Once the detection signal has been received, the identifier sends, using a RF (radio frequency) wave, its identification code to the ECU. If the ECU recognizes the identification code as that authorizing access to the vehicle it opens the door. In contrast, if the ECU does not receive a code or the code received is incorrect the door does not open.

Such a capacitive sensor consists of a capacitive electrode incorporated in the door handle, and its near environment, either directly or indirectly earthed, this environment possibly including a part of the body of a user the presence of which must be detected, here for example the hand of the driver forms a second earthed electrode. When the hand of the driver approaches the handle of the door, the capacitance of the capacitive electrode incorporated in the handle increases. The variation is measured using a reference capacitance, located on a printed circuit board connected to the capacitive electrode incorporated in the handle. If this capacitance is above a threshold, it means that detection has occurred, i.e. the hand of the driver is on the handle, or close enough to the handle of the door, and that he requires it to open.

It is known from the prior art that charge-transfer capacitive sensors allow the variation in the capacitance of a variable capacitance to be measured by implementing a cycle consisting of many charges and discharges of the capacitance of the electrode incorporated in the handle into the reference capacitance until a fixed voltage threshold across the terminals of the reference capacitance is reached. The variation in the capacitance of the electrode incorporated in the handle is estimated relative to the previous cycle from the variation in the number of discharges of the capacitive electrode integrated into the handle, into the reference capacitance, required in order to reach a threshold voltage across the terminals of the reference capacitance. These sensors use switches which allow current to flow so as to first charge the capacitance of the electrode incorporated in the handle by way of the supply voltage and then discharge the capacitance of the electrode incorporated in the handle into the reference capacitance and vice versa. The charge transfer, i.e. the succession of charges and discharges, according to the prior art, and illustrated in FIG. 1, breaks down into four steps:

1st step: the first step of the electrode consists in charging the capacitance $C_X$ using the supply voltage $V_{CC}$. To do this the first switch S1 is closed and the second switch S2 is opened.

2nd step: once the charging has finished, the first switch S1 is opened;

3rd step: next the discharging of the capacitance $C_X$ of the electrode into the reference capacitance $C_S$ may commence, to do this the first switch S1 remains open and the second switch S2 is closed; and 4th step: once discharging is complete, the second switch S2 is opened.

The transfer of charge is repeated until the voltage $V_S$ across the terminals of the reference capacitance reaches the threshold voltage $V_{TH}$. The number x of discharges of the capacitance $C_X$ of the electrode into the reference capacitance $C_S$ required in order to reach this threshold gives an idea of the capacitance $C_X$ of the electrode. The reference capacitance $C_S$ is then completely discharged, by way of the switch S, for the next measurement.

A counter of the number x of discharges and a microcontroller (not shown in FIG. 1) allow the capacitance $C_X$ of the electrode to be determined.

The behavior of the charge-transfer sensor is described by the following equation:

$$V_S(x) = \frac{C_X}{C_S} \times V_{CC} + V_S(x-1) \times \left(1 - \frac{C_X}{C_S}\right).$$

The variation of the voltage $V_S$ across the terminals of the reference capacitance is a function of the number x of discharges of the capacitance $C_X$ of the electrode into the reference capacitance $C_S$, and is given by equation (1):

$$V_S(x) = V_{CC} \times \left[1 - \left(1 - \frac{C_X}{C_S}\right)^x\right]. \tag{1}$$

At the end of the charge transfer, the voltage $V_S$ across the terminals of the reference capacitance reaches the threshold voltage $V_{TH}$, and a number x of discharges is obtained, defined by:

$$x = -\frac{C_S}{C_X} \times \ln\left(1 - \frac{V_{TH}}{V_{CC}}\right). \tag{2}$$

Th is defined as a detection threshold, corresponding to a number of charge transfers between the two states of $C_X$, i.e. between $C_X$ and $C_X + \Delta C_X$.

Th is equal to the variation in the number x of discharges between the value of the capacitance $C_X$ and the value of the capacitance $C_X + \Delta C_X$. Consequently:

$$Th = -\frac{C_S}{C_X} \times \ln\left(1 - \frac{V_{TH}}{V_{CC}}\right) + \frac{C_S}{C_X + \Delta C_X} \times \ln\left(1 - \frac{V_{TH}}{V_{CC}}\right),$$

which gives:

$$\Delta C_X = \frac{-Th \times C_X^2}{C_S \times \ln\left(1 - \frac{V_{TH}}{V_{CC}}\right) - Th \times C_X}.$$

As the reference capacitance $C_S$ according to the prior art is considerably higher than the capacitance $C_X$ of the electrode the following equation is obtained for the variation $\Delta C_X$ in the capacitance $C_X$:

$$\Delta C_X \approx \frac{-Th \times C_X^2}{C_S \times \ln\left(1 - \frac{V_{TH}}{V_{CC}}\right)}. \quad (3)$$

Consequently, with such a capacitive sensor, the measurable variation $\Delta C_X$ of the capacitance $C_X$, i.e. the sensitivity of the sensor, defined by equation (3), depends on a number of parameters: the storage value of the reference capacitance $C_S$, the supply voltage $V_{CC}$, the measurement-stop threshold voltage $V_{TH}$ and above all mainly on the capacitance of the electrode, squared $C_X^2$. However, the capacitance $C_X$ of the electrode is difficult to control and varies depending on the environment (temperature, humidity, service life) thereby reducing the sensitivity and the performance of the sensor.

In addition, x, the number of discharges which defines the measurement time, is proportional to the reference capacitance $C_S$ (cf. equation 2), which is itself dependent on the other parameters and in particular on the desired sensitivity $\Delta C_X$ (cf. equation 3). Thus a value of the reference capacitance $C_S$ and therefore a fixed number x of discharges (Th, $V_{CC}$, $V_{TH}$, and $C_X$ being fixed parameters) corresponds to a given sensor sensitivity $\Delta C_X$. Consequently the number x of discharges, i.e. the duration of charge transfer, or the duration of the measurement of the variation of the capacitance $C_X$ until detection, is fixed and cannot be optimized. This is because, if the number x of discharges is halved, for example, so as to reduce the measurement time, the reference capacitance $C_S$ is halved according to equation (2), and consequently the sensitivity of the sensor $\Delta C_X$ of the sensor is reduced, since it is doubled according to equation (3). With such a device, there is therefore no way of optimizing the measurement time of the capacitive sensor without affecting the sensitivity.

However, the measurement time of the capacitive sensor must be extremely rapid:
- the door opening mechanism must be completely transparent to the driver. This is because the latter expects the door to open as quickly as in the case of opening using a mechanical handle; and
- the power consumption of the sensor must be minimized, because it operates over long periods when the vehicle is stopped. Since the power consumption is related to the measurement time, if the measurement time is reduced, the power consumption drops.

However, as explained above, it being given that reducing the measurement time causes a reduction in the precision of the sensor, this may cause detection to be delayed too much. There is therefore a necessary compromise between the measurement time and the desired precision, i.e. the desired sensitivity, of the sensor. There is therefore a considerable advantage in producing a sensor, the sensitivity of which is independent of the measurement time.

The subject of the present invention is a charge-transfer capacitive sensor the sensitivity of which is independent of the capacitance of the electrode and with which the measurement time may be optimized i.e. the number of discharges may be reduced without affecting the sensitivity of the sensor.

These aims of the invention are achieved by means of a device for measuring a variation $\Delta C_X$ in the capacitance of a variable capacitive structure $C_X$, comprising:
- a supply voltage $V_{CC}$;
- means for charging the variable capacitive structure using the supply voltage;
- means for discharging the variable capacitive structure into a reference capacitance $C_S$ in a fixed number x of discharges;
- means for measuring a voltage $V_S$ across the terminals of the reference capacitance;
- means for charging a measurement capacitive structure $C_M$ using the supply voltage;
- means for discharging the measurement capacitive structure into the reference capacitance in a variable number n of discharges; and
- means for detecting a threshold voltage $V_{TH}$ across the terminals of the reference capacitance, said device being configured/programmed so that the measurement capacitive structure discharges, in a variable number of discharges, into the reference capacitance after the variable capacitive structure has been discharged, in a fixed number of discharges, into the reference capacitance. Thus, the variation in the variable number of discharges relative to a previously obtained number of discharges allows the variation in the capacitance of the variable capacitive structure to be estimated.

Advantageously, a preset detection threshold Th of a number of discharges of the measurement capacitive structure into the reference capacitance is defined, corresponding to the variation of the capacitance of the variable capacitive structure, from the value $C_X$ to the value $C_X + \Delta C_X$.

In a first embodiment, the fixed and preset number of discharges of the variable capacitive structure into a reference capacitance is defined by:

$$x = \frac{Th \times C_M}{\Delta C_X}.$$

In a second embodiment, the variable number of discharges of the measurement capacitive structure into the reference capacitance is defined when the voltage across the terminals of the reference capacitance is equal to the threshold voltage:

$$n = -\frac{C_S \times \ln\left(1 - \frac{V_{TH}}{V_{CC}}\right) + x \times C_X}{C_M}.$$

According to an important feature of the present invention, the measurement of the variation in the variable capacitive structure is independent of the variable capacitive structure and is equal to:

$$\Delta C_X = \frac{Th \times C_M}{x}.$$

Judiciously, the value of the measurement capacitive structure is fixed and lower than the capacitance of the variable capacitive structure.

In a third embodiment, the reference capacitance is determined when the voltage across the terminals of the reference capacitance is lower than the threshold voltage:

$$C_S \geq \left| \frac{x \times C_X}{\ln\left(1 - \frac{V_{TH}}{V_{CC}}\right)} \right|.$$

Advantageously, the reference capacitance has a higher capacitance than that of the variable capacitive structure and the measurement capacitance has a lower capacitance than that of the variable capacitive structure.

In a preferred embodiment, the measurement capacitance has a capacitance equivalent to a residual capacitance.

In an embodiment combining the preceding embodiments, the device furthermore comprises switching means, controlled so as to charge and/or discharge the variable capacitive structure and switching means, controlled so as to charge and/or discharge the measurement capacitance.

Of course, the invention is applicable to any capacitive sensor, for detecting the presence of a user of a piece of equipment, employing a device for measuring a variation in the capacitance of a variable capacitive structure, comprising for example a detection electrode placed within the piece of equipment, and the capacitance of the variable capacitive structure being determined between the detection electrode and the environment near the detection electrode, the piece of equipment in which the detection electrode is placed possibly being a door handle of a vehicle.

The invention also relates to any method of reducing the measuring time of a capacitance variation, in a variable capacitive structure employing the device described above.

Other features and advantages of the invention will become clear on reading the following description and on examining the appended drawings in which:

FIG. 1 shows a schematic view of a charge-transfer capacitive sensor according to the prior art, described above;

FIG. 2 shows a schematic view of a door handle of a vehicle, incorporating a charge-transfer capacitive sensor; and FIG. 3 shows a schematic view of a charge-transfer capacitive sensor according to the invention.

As illustrated in FIG. 2, the charge-transfer capacitive sensor 3, incorporated in a door handle 6 of a vehicle comprises an electrode 4 the capacitance $C_X$ of which varies and a reference capacitance $C_S$, located on a printed circuit board 5, the latter also being incorporated in the handle 6. When the hand of the driver approaches the handle 6 of the door from the far position 1 to the near position 2 (FIG. 2), the capacitance $C_X$ of the electrode increases by an amount $\Delta C_X$, this variation $\Delta C_X$ is measured using the reference capacitance $C_S$, located on the printed circuit board 5 connected to the electrode 4. If this capacitance is above a threshold it means that the hand of the driver is in a position 2 near the handle of the door, and he wants the door to open.

The prior art, illustrated in FIG. 1, shows such a capacitive sensor, measuring the variation in the capacitance of a variable capacitance, implementing a cycle consisting of a large number x of charges and discharges of the capacitance $C_X$ of the electrode into the reference capacitance $C_S$ until the voltage $V_S$ across the terminals of the reference capacitance reaches a fixed voltage threshold equal to $V_{TH}$. The variation in the capacitance $C_X$ of the electrode relative to the previous cycle is estimated using the variation in the number x of discharges of the capacitance $C_X$ of the electrode into the reference capacitance $C_S$ that were required to reach the threshold voltage $V_{TH}$ across the terminals of the reference capacitance $C_S$.

The present invention proposes to add to this device a third capacitance, called the measurement capacitance $C_M$ (FIG. 3) so as to measure the variation in the capacitance $C_X$ in such a way that the sensitivity of the sensor $\Delta C_X$ is independent of the measured capacitance $C_X$ of the electrode and also so that optimization of the measurement time until detection (i.e. the number of charges and/or discharges) of the capacitive sensor is possible without affecting the sensitivity $\Delta C_X$. The measurement capacitance $C_M$ is earthed and supplied by the supply voltage $V_{CC}$. Two switches S3 and S4, allow the measurement capacitance $C_M$ to be charged using the supply voltage $V_{CC}$, then this capacitance to be discharged into the reference capacitance $C_S$ a variable number n of times.

A charge-transfer counter (not shown) counts the number n of discharges from the measurement electrode $C_M$ into the reference capacitance $C_S$.

A microcontroller (not shown) calculates, from this number n of discharges, and from the known, fixed number x of discharges, the capacitance $C_X$ of the electrode.

The measurement time is proportional to the total-discharge number N, N being equal to the sum of the fixed number x of discharges and the variable number n of discharges.

The transfer of charge according to the invention breaks down into two phases: an acquisition phase and a measurement phase.

The acquisition phase consists of a conventional transfer of charge from the capacitance $C_X$ of the electrode to the reference capacitance $C_S$. The difference with the conventional charge transfer is that the transfer of charge stops after a fixed number x of discharges, and not when the voltage $V_S$ across the terminals of the reference capacitance reaches a voltage threshold $V_{TH}$.

The measurement phase consists in transferring charge, in a variable number n of discharges, from the measurement capacitance $C_M$ to the reference capacitance $C_S$ until the voltage $V_S$ across the terminals of the reference capacitance reaches the threshold voltage $V_{TH}$.

During the acquisition phase, the charge held by capacitance $C_X$ of the electrode is transferred to the reference capacitance $C_S$ in the following manner:

1st step: the first step consists in charging the capacitance $C_X$ of the electrode using the supply voltage $V_{CC}$, to do this the first switch S1 is closed and the second switch S2 is opened;

2nd step: once $C_X$ is charged, the first switch S1 is opened;

3rd step: the discharge of the capacitance $C_X$ of the electrode into the reference capacitance $C_S$ may commence. To do this, the first switch S1 remains open and the second switch S2 is closed;

4th step: once the discharge of $C_X$ into $C_S$ is completed, the second switch S2 is opened.

The third and the fourth switch S3 and S4 are open during this phase. Consequently, $C_M$ is neither charged nor discharged during this phase.

This cycle of charges and discharges is repeated a preset and fixed number x of times.

During the measurement phase, the charge held by the measurement capacitance $C_M$ is transferred to the reference capacitance $C_S$ until the voltage $V_S$ across the terminals of this capacitance reaches a threshold $V_{TH}$.

1st step: the first step consists in charging the measurement capacitance $C_M$. To do this the third switch S3 is closed and the fourth switch S4 is opened;

2nd step: once $C_M$ is charged, the third switch S3 is opened;

3rd step: the discharge of the measurement capacitance $C_M$ into the measurement capacitance $C_S$ may commence. To do this, the third switch S3 remains open and the fourth switch S4 is closed;

4th step: once the discharge of $C_M$ into $C_S$ is completed, the fourth switch S4 is opened.

The first and the second switch S1 and S2 are open during this phase. Consequently $C_X$ is neither charged nor discharged during this phase.

This cycle is repeated until the voltage $V_S$ across the terminals of the reference capacitance $C_S$ reaches the threshold voltage $V_{TH}$. The variable number (called n) of discharges required to reach the threshold gives an idea of the capacitance $C_X$. The reference capacitance $C_S$ is then completely discharged by closing the switch S, for the next measurement.

The equations describing the behavior of the linear charge-transfer sensor are the following:

the equation of charge transfer from the capacitance $C_X$ of the electrode to the reference capacitance $C_S$ is in principle unchanged from the prior art (cf. equation (1)).

However, the equation describing the transfer of charge from the measurement capacitance $C_M$ to the reference capacitance $C_S$ is now dependent on the measurement capacitance $C_M$ and on the capacitance $C_X$ of the electrode:

$$V_S(n) = V_{CC} \times \left[1 - \left(1 - \frac{C_X}{C_S}\right)^x \times \left(1 - \frac{C_M}{C_S}\right)^n\right]; \quad (4)$$

which gives, when the voltage $V_S$ across the terminals of the reference capacitance is equal to the threshold voltage $V_{TH}$, a variable number n of discharges equivalent to:

$$n = -\frac{C_S \times \ln\left(1 - \frac{V_{TH}}{V_{CC}}\right) + x \times C_X}{C_M}. \quad (5)$$

A detection threshold Th is defined. This threshold is equal to a number n of discharges of the measurement capacitance $C_M$ into the reference capacitance $C_S$, corresponding to the detection of the hand of the driver on the handle 6 of the door. For example, Th is equal to five, meaning that detection occurs when five transfers of charge from the measurement capacitance $C_M$ to the reference capacitance $C_S$ have been carried out. These five transfers of charge signify that the capacitance of the electrode $C_X$ has changed by a significant amount $\Delta C_X$, i.e. that the hand of the driver is touching the handle 6 of the door and that he wants the door to open. It should be noted that the definition of the threshold Th is identical to that of the prior art except that in the invention it applies to the variable number n of discharge transfers, and not to the number x of discharges.

Th being defined as corresponding to the difference, between the two states of the electrode, between the capacitance $C_X$ and the capacitance $C_X + \Delta C_X$, it is therefore equal to:

$$Th = -\frac{C_S \times \ln\left(1 - \frac{V_{TH}}{V_{CC}}\right) + x \times C_X}{C_M} + \frac{C_S \times \ln\left(1 - \frac{V_{TH}}{V_{CC}}\right) + x \times (C_X + \Delta C_X)}{C_M};$$

i.e.:

$$Th \times C_M = x \times \Delta C_X;$$

and consequently the variation $\Delta C_X$ in the capacitance $C_X$ of the electrode is given by the following equation:

$$\Delta C_X = \frac{Th \times C_M}{x}. \quad (6)$$

Thus the sensitivity of the sensor $\Delta C_X$ according to the invention is no longer dependent on the variable capacitance $C_X$ of the electrode. It is now determined only by the fixed number x of discharges in the acquisition phase and the value of the measurement capacitance $C_M$, and of the detection threshold Th which are also fixed values (cf. equation 6).

In order to obtain a suitably precise value for the capacitance $C_X$ of the electrode, the value of the measurement capacitance $C_M$ must be lower than the value of the capacitance $C_X$ of the electrode. The value of the measurement capacitance $C_M$ may for example be set to a minimum, i.e. equivalent to the value of a residual capacitance, i.e. 10 pF. The value of the measurement capacitance $C_M$ being fixed, it is possible to calculate x using equation 7.

$$x = \frac{Th \times C_M}{\Delta C_X}. \quad (7)$$

Once the number x of discharges has been determined, the value of the reference capacitance $C_S$ can be determined. This is because, in order for the transfer of charge from the measurement capacitance $C_M$ to the reference capacitance $C_S$ to take place, it is necessary, after the number x of discharges from the capacitance $C_X$ of the electrode into the reference capacitance $C_S$, for the voltage $V_S$ across the terminals of the reference capacitance to not have reached the threshold voltage $V_{TH}$ for detection. Consequently a constraint on $V_S$ is:

$$V_S < V_{TH}.$$

The threshold voltage as a function of the number x of discharges, $V_S(x)$, is given by equation (1).

Consequently, the constraint $V_S < V_{TH}$ is equivalent to:

$$V_{TH} > V_{CC} \times \left[1 - \left(1 - \frac{C_X}{C_S}\right)^x\right],$$

i.e. $\left(1 - \frac{V_{TH}}{V_{CC}}\right) < \left(1 - \frac{C_X}{C_S}\right)^x,$ and therefore $$\ln\left(1 - \frac{V_{TH}}{V_{CC}}\right) < x \times \ln\left(1 - \frac{C_X}{C_S}\right).$$

Using the finite Taylor series expansion of $\ln(1+x)$:

$$\ln(1 + x) = x - \frac{x^2}{2} + \frac{x^3}{3} \ldots \approx x$$

we obtain $$x \times \ln\left(1 - \frac{C_X}{C_S}\right) \approx -x \times \frac{C_X}{C_S},$$

and consequently $$C_S \leq \frac{-x \times C_X}{\ln\left(1 - \frac{V_{TH}}{V_{CC}}\right)}.$$

Since the value of the threshold voltage $V_{TH}$ is lower than the value of the supply voltage, the value of the expression $\ln(1-V_{TH}/V_{CC})$ is negative, and $$C_S \geq \left|\frac{x \times C_X}{\ln\left(1 - \frac{V_{TH}}{V_{CC}}\right)}\right|. \quad (8)$$

The reference capacitance $C_S$ therefore has a minimum value for a given number x of discharges, so as to provide the precision $\Delta C_X$.

Calling the value of the reference capacitance $C_S$ according to the invention $C_{S2}$ and comparing it with the value of the reference capacitance $C_S$ of the prior art, which will be called $C_{S1}$, which is defined by equation (3), i.e.:

$$C_{S1} \approx \frac{-Th \times C_X^2}{\Delta C_X \times \ln\left(1 - \frac{V_{TH}}{V_{CC}}\right)},$$

and assuming that the values of the detection threshold Th, the capacitance $C_X$ of the electrode, the sensitivity of the sensor $\Delta C_X$, the supply voltage $V_{CC}$ and the threshold voltage $V_{TH}$ parameters are identical in the prior art and in the invention, the following is obtained:

$$C_{S2} = |C_{S1}| \times \frac{x \times \Delta C_X}{Th \times C_X}.$$

Given the value of the fixed number x of discharges, defined in equation (7) and the fact that the value of $\ln(1-V_{TH}/V_{CC})$ is negative, the following is obtained:

$$C_{S2} = C_{S1} \times \frac{C_M}{C_X} \quad (9)$$

The value of the measurement capacitance $C_M$ being defined as being much lower than the value of the capacitance $C_X$ of the electrode, consequently $C_{S2} < C_{S1}$.

The reference capacitance $C_{S2}$ according to the invention has a smaller value than that $C_{S1}$ used in the prior art, and this for the same sensor precision $\Delta C_X$.

Consequently, the total number of discharges according to the invention, i.e. N, is lower than the number x of discharges of the prior art. The measurement time is therefore greatly reduced by the invention without affecting the precision of the sensor.

Of course, the invention is not limited to the embodiment described and shown, which was given only by way of example. The invention also applies to any method of measuring a variation $\Delta C_X$ in a capacitance $C_X$ implementing the device according to the invention and detailed above.

The invention claimed is:

1. A device for measuring a variation ($\Delta C_X$) in the capacitance of a variable capacitive structure ($C_X$), comprising:
   a supply voltage ($V_{CC}$);
   means for charging the variable capacitive structure ($C_X$) using the supply voltage ($V_{CC}$);
   means for discharging the variable capacitive structure ($C_X$) into a reference capacitance ($C_S$) in a fixed number (x) of discharges;
   means for measuring a voltage ($V_S$) across the terminals of the reference capacitance;
   means for charging a measurement capacitive structure ($C_M$) using the supply voltage ($V_{CC}$);
   means for discharging the measurement capacitive structure ($C_M$) into the reference capacitance ($C_S$) in a variable number (n) of discharges; and
   means for detecting a threshold voltage ($V_{TH}$) across the terminals of the reference capacitance ($C_S$),
   characterized in that the device is configured/programmed so that the discharge of the measurement capacitive structure ($C_M$), in a variable number (n) of discharges, into the reference capacitance ($C_S$) is carried out after the variable capacitive structure ($C_X$) has been discharged, in the fixed number (x) of discharges, into the reference capacitance ($C_S$), and in that the variation in the variable number (n) of discharges relative to a previously obtained number of discharges allows the variation ($\Delta C_X$) in the capacitance of the variable capacitive structure ($C_X$) to be estimated.

2. The device as claimed in claim 1, characterized in that a preset detection threshold (Th) of a number of discharges of the measurement capacitive structure ($C_M$) into the reference capacitance ($C_S$) is defined, corresponding to the variation ($\Delta C_X$) of the capacitance of the variable capacitive structure ($C_X$).

3. The device as claimed in claim 1, characterized in that the fixed number (x) of discharges of the variable capacitive structure ($C_X$) into the reference capacitance ($C_S$) is defined by:

$$x = \frac{Th \times C_M}{\Delta C_X}.$$

4. The device as claimed in claim 1, characterized in that the variable number (n) of discharges of the measurement capacitive structure ($C_M$) into the reference capacitance ($C_S$) is defined when the voltage across the terminals of the reference capacitance ($V_S$) is equal to the threshold voltage ($V_{TH}$):

$$n = -\frac{C_S \times \ln\left(1 - \frac{V_{TH}}{V_{CC}}\right) + x \times C_X}{C_M}.$$

5. The device as claimed in claim 1, characterized in that the measurement of the variation ($\Delta C_X$) in the variable capacitive structure is independent of the variable capacitive structure ($C_X$) and is equal to:

$$\Delta C_X = \frac{Th \times C_M}{x}.$$

6. The device as claimed in claim 1, characterized in that the value of the measurement capacitive structure ($C_M$) is fixed and lower than the capacitance of the variable capacitive structure ($C_X$).

7. The device as claimed in claim 1, characterized in that the reference capacitance ($C_S$) is determined when the voltage ($V_S$) across the terminals of the reference capacitance is lower than the threshold voltage ($V_{TH}$):

$$C_S \geq \left| \frac{x \times C_X}{\ln\left(1 - \frac{V_{TH}}{V_{CC}}\right)} \right|.$$

8. The device as claimed in claim 1, characterized in that the reference capacitance ($C_S$) has a higher capacitance than that of the variable capacitive structure ($C_X$).

9. The device as claimed in claim 1, characterized in that the measurement capacitance ($C_M$) has a lower capacitance than that of the variable capacitive structure ($C_X$).

10. The device as claimed in claim 1, characterized in that the measurement capacitance ($C_M$) has a capacitance equivalent to a residual capacitance.

11. The device as claimed in claim 1, characterized in that it furthermore comprises switching means, controlled so as to charge and/or discharge the variable capacitive structure ($C_X$).

12. The device as claimed in claim 1, characterized in that it furthermore comprises switching means, controlled so as to charge and/or discharge the measurement capacitance ($C_M$).

13. A capacitive sensor, for detecting the presence of a user of a piece of equipment, employing a device for measuring a variation in the capacitance of a variable capacitive structure ($C_X$) as claimed in claim 1, characterized in that the capacitive structure ($C_X$) the capacitance variation of which is detected comprises a detection electrode placed within said piece of equipment, the capacitance of the capacitive structure being determined between said detection electrode and the environment near said detection electrode.

14. The capacitive sensor, as claimed in claim 13, characterized in that the piece of equipment in which the detection electrode is placed is a door handle of a vehicle.

15. A method of measuring a capacitance variation, called ($\Delta C_X$), in a variable capacitive structure ($C_X$), employing the device as claimed in claim 1.

\* \* \* \* \*